(12) United States Patent
Park

(10) Patent No.: US 7,180,151 B2
(45) Date of Patent: Feb. 20, 2007

(54) IMAGE SENSOR HAVING SELF-ALIGNED AND OVERLAPPED PHOTODIODE AND METHOD OF MAKING SAME

(75) Inventor: Young Hoon Park, Yongin (KR)

(73) Assignee: Samsung Electronics Co., Ltd. (KR)

( * ) Notice: Subject to any disclaimer, the term of this patent is extended or adjusted under 35 U.S.C. 154(b) by 92 days.

(21) Appl. No.: 11/044,422

(22) Filed: Jan. 27, 2005

(65) Prior Publication Data

US 2006/0006489 A1    Jan. 12, 2006

(30) Foreign Application Priority Data

Jul. 7, 2004    (KR) ........................ 10-2004-0052694

(51) Int. Cl.
*H01L 31/06*    (2006.01)
(52) U.S. Cl. ................ 257/462; 257/233; 257/292; 257/E31.084; 257/E27.133; 438/60; 438/75
(58) Field of Classification Search ................ 257/233, 257/292, 461, 462, 465, E31.084, E27.133; 438/60, 75
See application file for complete search history.

(56) References Cited

U.S. PATENT DOCUMENTS 6,023,081 A    2/2000  Drowley et al. ............ 257/292
6,306,676 B1   10/2001 Stevens et al. ............... 438/48
6,504,193 B1 *  1/2003 Ishiwata et al. ............. 257/291
6,642,076 B1 * 11/2003 Yaung et al. ................. 438/48
2003/0173585 A1 9/2003 Kimura et al. .............. 257/197

FOREIGN PATENT DOCUMENTS

| JP | 2002-231915 | 8/2002 |
| KR | 2000-41446 | 7/2000 |
| KR | 03-37870 | 5/2003 |
| KR | 2003-37870 | 5/2003 |
| KR | 03-58291 | 7/2003 |
| KR | 2003-58291 | 7/2003 |

* cited by examiner

*Primary Examiner*—Kenneth Parker
*Assistant Examiner*—Matthew E. Warren
(74) *Attorney, Agent, or Firm*—Mills & Onello LLP

(57) ABSTRACT

An image sensing device includes a gate dielectric layer formed on a substrate and a transfer gate formed on the gate dielectric layer. A masking layer is formed on the transfer gate, the masking layer having a width smaller than a width of the transfer gate, such that a portion of the transfer gate protrudes laterally from under the masking layer. A photodiode is formed in the substrate to be self-aligned with the masking layer and to extending laterally under the transfer gate, that is, to overlap the transfer gate. Because of the overlap of the photodiode with the transfer gate, offset between the photodiode and the transfer gate is eliminated, such that an image lag phenomenon is eliminated.

16 Claims, 10 Drawing Sheets

IMAGE SENSOR HAVING SELF-ALIGNED AND OVERLAPPED PHOTODIODE AND METHOD OF MAKING SAME

RELATED APPLICATION

This application relies for priority on Korean Patent Application number 2004-52694, filed in the Korean Intellectual Property Office on Jul. 7, 2004, the contents of which are incorporated herein in their entirety by reference.

FIELD OF THE INVENTION

The invention is related to image sensors.

BACKGROUND OF THE INVENTION

Image sensors are devices which receive an optical signal from an object and convert the optical signal to an electrical signal. The electrical signal can then be transmitted for further processing, such as digitization and then storage in a storage device such as a memory or optical or magnetic disk, or for presentation on a display, printing, etc. Image sensors are typically used in devices such as digital cameras, camcorders, printers, facsimile machines, etc.

Image sensors are typically of two types, namely, charge coupled device (CCD) sensors and CMOS image sensors (CIS). CCD sensors typically have advantages including low noise operation and device uniformity. CIS devices are typically characterized by low power consumption and can be operated at high speed due to a high frame rate capability.

FIG. 1 is a schematic cross-sectional diagram of a conventional image sensor. Referring to FIG. 1, the image sensor includes a substrate 1. An isolation layer 3 is formed in the substrate 1. An n-type photodiode 5 is formed in the substrate1 by an n-type high-energy ion implantation using photoresist as a mask. A transfer gate structure 10, which includes a gate dielectric 7 and a gate electrode 9 made of, for example, polysilicon, is formed over the substrate 1. An n-type floating diffusion region 13 is formed in the substrate 1 by n-type high-concentration ion implantation using the transfer gate structure 10 as an implantation mask. A p-type hole accumulated device (HAD) region 15 is formed by p-type high-concentration ion implantation using the transfer gate structure 10 as an implantation mask. A channel region 17 is formed between the floating diffusion region 13 and the HAD region 15.

As illustrated in FIG. 1, the n-type floating diffusion region 13 and the p-type HAD region 15 are formed to be self-aligned with the transfer gate structure 10. However, because of possible misalignment, the n-type photodiode 5 may not extend laterally to the edge of the transfer gate structure 10. This results in formation of an offset region 19 between the edge of the photodiode 5 and the edge of the transfer gate structure 10. This offset region results in an undesirable "image lag" phenomenon in the sensor device.

FIG. 2 is an energy band diagram corresponding to the image sensor device of FIG. 1. Referring to FIG. 2, the diagram shows the energy bands for the photodiode region 5, the floating diffusion region 13, the channel region 17 and the offset region 19 of the device. FIG. 2 illustrates potential level of a corresponding conduction band $E_C$ in the photodiode 5, offset 19, channel 17 and floating diffusion 13 regions.

As illustrated in FIG. 2, some amount of electron charges E1 and E2 are generated in the photodiode region 5 in response to incident light. The amount of charge is dependent upon the intensity of the incident light. When the transfer gate electrode 9 has a high pulse applied, the potential level indicated in FIG. 2 is lower, i.e., more positive. That is, $E_{CH}' > E_{CH}''$. The E1 group of electron charges will be transferred to the floating diffusion region 13. However, the E2 group of charges will remain in the photodiode region. These remaining E2 charges are trapped by the high potential barrier $H_B$ caused by the offset region 19. The E2 group of charges remaining in the photodiode region result in the image lag phenomenon.

SUMMARY OF THE INVENTION

A feature of the invention is to provide an image sensor device and a method for manufacturing an image sensor device in which the offset region in the prior art, and, therefore, the resulting image lag, are eliminated.

In accordance with a first aspect, the invention is directed to a device which includes a gate dielectric layer formed on a substrate. A transfer gate is formed on the gate dielectric layer. A masking layer is formed on the transfer gate, the masking layer having a width smaller than a width of the transfer gate, such that a portion of the transfer gate protrudes laterally from under the masking layer. A photodiode is formed in the substrate to be self-aligned with the masking layer and extending laterally under the transfer gate.

The device can further include a hole accumulated device (HAD) region formed in the substrate to be aligned with an edge of the transfer gate.

In one embodiment, the photodiode is an n-type photodiode.

The device can further include a floating diffusion region, a reset transistor, a In one embodiment, the device further includes a second transfer gate formed on the gate dielectric layer; a second masking layer formed on the transfer gate, the second masking layer having a width smaller than a width of the second transfer gate, such that a portion of the second transfer gate protrudes laterally from under the second masking layer; and a second photodiode formed in the substrate to be self-aligned with the second masking layer and extending laterally under the second transfer gate. In one embodiment, the second photodiode is an n-type photodiode. The device can further include a floating diffusion region shared by the first and second photodiodes. The device can also further include a reset transistor, a driver transistor and/or a select transistor.

In one embodiment, the masking layer comprises silicon oxynitride. In another embodiment, the masking layer comprises silicon nitride. In one embodiment, the transfer gate comprises polysilicon.

In accordance with another aspect, the present invention is directed to a method of forming an image sensor. In accordance with the method, a gate dielectric layer is formed on a substrate, and a transfer gate is formed on the gate dielectric layer. A masking layer is formed on the transfer gate, the masking layer having a width smaller than a width of the transfer gate, such that a portion of the transfer gate protrudes laterally from under the masking layer. A photodiode is formed in the substrate to be self-aligned with the masking layer and extending laterally under the transfer gate.

In one embodiment, forming the transfer gate comprises etching a transfer gate layer. The transfer gate can be anisotropically etched. In one embodiment, forming the masking layer comprises etching the masking layer. The masking layer can be anisotropically etched. In one embodiment, the masking layer and the transfer gate are etched sequentially. In one embodiment, both the masking layer and the transfer gate are anisotropically etched. In one embodiment, forming the masking layer comprises isotropically etching the masking layer.

In one embodiment, forming the masking layer comprises performing a first etching step and a second etching step. The first etching step and/or the second etching step can be an anisotropic etching step. The second etching step can include wet etching. The etchant used in the second etching step can include NH$_4$OH. The etchant used on the second etching step can include H$_2$O$_2$. The etchant used in the second etching step can include HF.

In one embodiment, the method further comprises forming a hole accumulated device (HAD) region in the substrate to be aligned with an edge of the transfer gate. The method can include forming a floating diffusion region, a reset transistor, a driver transistor and/or a select transistor.

In one embodiment, the photodiode is an n-type photodiode.

In one embodiment, the method further comprises: forming a second transfer gate on the gate dielectric layer; forming a second masking layer on the transfer gate, the second masking layer having a width smaller than a width of the second transfer gate, such that a portion of the second transfer gate protrudes laterally from under the second masking layer; and forming a second photodiode in the substrate to be self-aligned with the second masking layer and extending laterally under the second transfer gate.

In one embodiment, the second photodiode is an n-type photodiode.

In one embodiment, the method further comprises forming a floating diffusion region shared by the first and second photodiodes. The method can also include forming a reset transistor, a driver transistor and/or a select transistor.

In one embodiment, the masking layer comprises silicon oxynitride. In one embodiment, the masking layer comprises silicon nitride. In one embodiment, the transfer gate comprises polysilicon.

BRIEF DESCRIPTION OF THE DRAWINGS

The foregoing and other features and advantages of the invention will be apparent from the more particular description of an embodiment of the invention, as illustrated in the accompanying drawing. The drawings are not necessarily to scale, emphasis instead being placed upon illustrating the principles of the invention. Like reference characters refer to like elements throughout the drawings.

DETAILED DESCRIPTION OF PREFERRED EMBODIMENTS OF THE INVENTION

Figure 3:
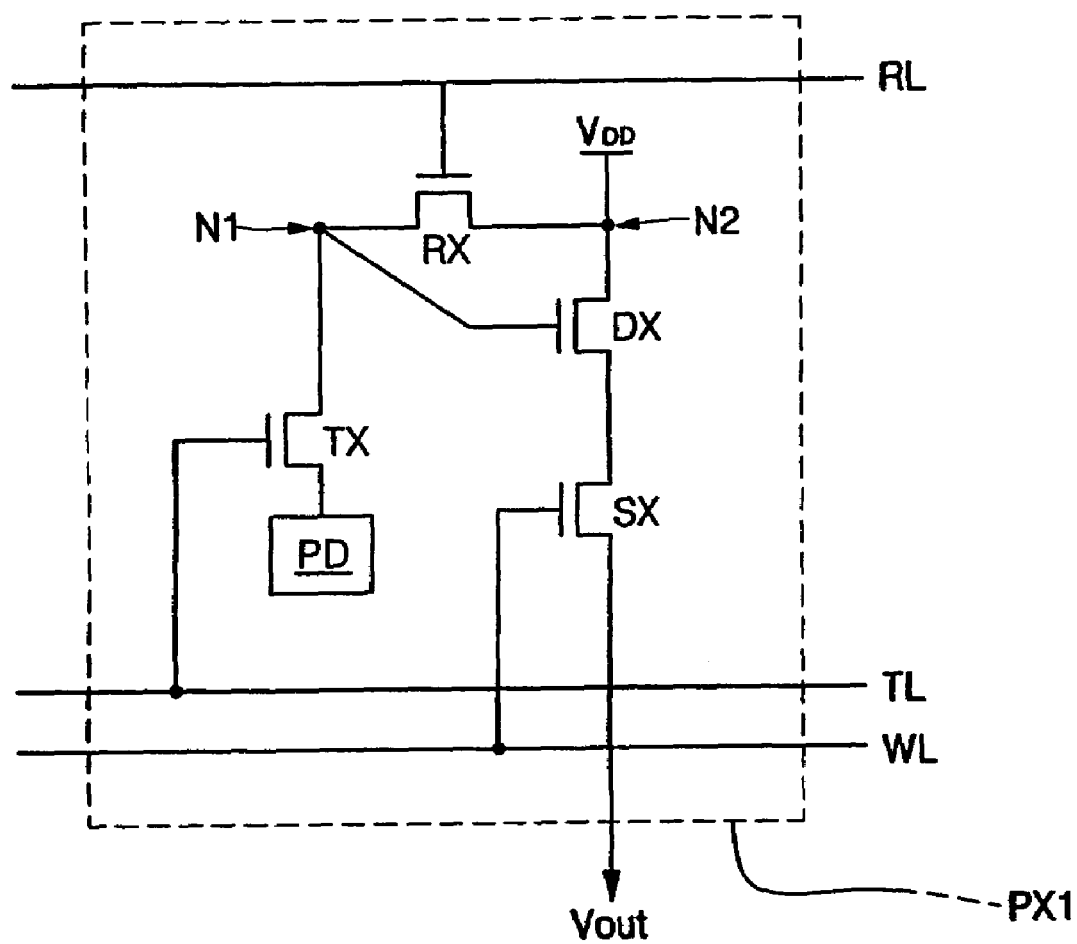
FIG. 3 is a schematic diagram of a pixel portion of a four-tiered type CMOS image sensor (CIS) which is applicable to the present invention.

FIG. 3 is a schematic diagram of a pixel portion of a four-tiered type CMOS image sensor (CIS) which is applicable to the present invention. Referring to FIG. 3, the active pixel PX1 of the CMOS image sensor includes a photodiode PD that captures incident light and converts the light to an electric charge. A transfer transistor TX passes the charge generated by the photodiode PD from the photodiode PD to a floating diffusion region N1 in response to a control signal on a transfer activation line TL. A reset transistor RX resets the charge accumulated in the floating diffusion region N1 to a reference level in response to a control signal of a reset line RL. A driver transistor DX, which is used in a source follower (amplifier) configuration, buffers the voltage at N1 to the output $V_{OUT}$. A select transistor SX is used to select the active pixel in response to a control signal on line WL.

Figure 4:
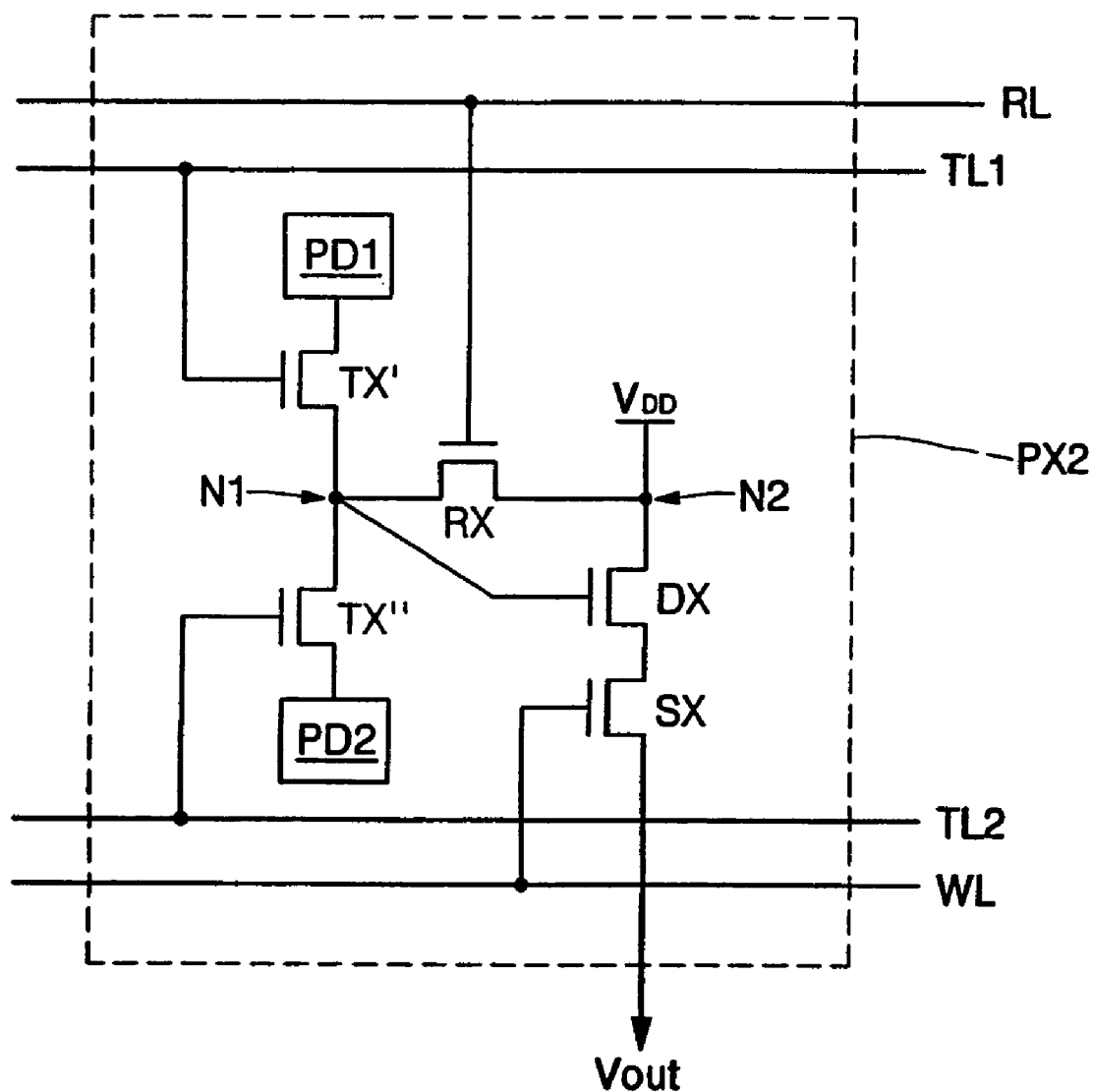
FIG. 4 is a schematic diagram of a pixel portion of a five-tiered type CMOS image sensor (CIS) which is applicable to the present invention.

FIG. 4 is a schematic diagram of a pixel portion of a five-tiered type CMOS image sensor (CIS) which is applicable to the present invention. In the five-tiered CIS, two active pixels PX2 are formed using two photodiodes PD1 and PD2. As shown in FIG. 4, the two photodiodes PD1 and PD2 share the floating diffusion region N1. This shared floating diffusion region N1 results in a more efficient image device.

Referring to FIG. 4, the CIS device includes the two photodiodes PD1 and PD2. Two corresponding transfer transistors TX' and TX" pass electric charge from the photodiodes PD1 and PD2, respectively, to the shared floating diffusion region N1 in response to control signals on transfer control lines TL1 and TL2, respectively. If the control signal on line TL1 is at a high level and the control signal on line TL2 is low, transfer transistor TX' is on to transfer charge from photodiode PD1 to the shared floating diffusion region N1 and transfer transistor TX" is off. If the control signal on line TL1 is at a low level and the control signal on line TL2 is high, transfer transistor TX" is on to transfer charge from photodiode PD2 to the shared floating diffusion region N1, and transfer transistor TX' is off. The reset transistor RX resets the charge accumulated in the shared floating diffusion region N1 to a reference level in response to a control signal on reset line RL. A driver transistor DX, which is used in a source follower (amplifier) configuration, buffers the voltage at N1 to the output $V_{OUT}$. A select transistor SX is used to select the active pixels PX2 in response to a control signal on line WL.

Figure 5:
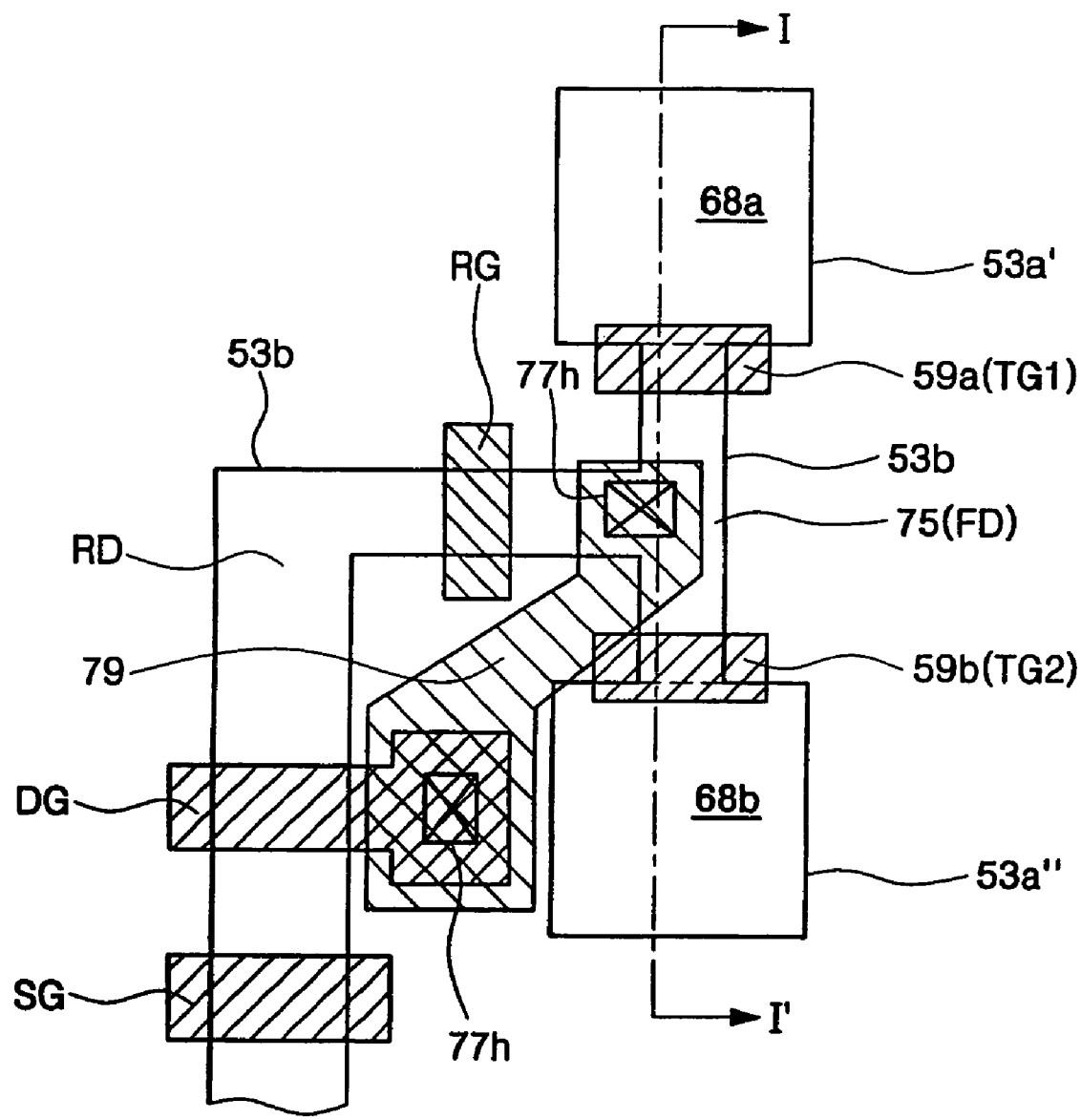
FIG. 5 is a schematic top layout view of the circuit of FIG. 4.

FIG. 5 is a schematic top layout view of the circuit of FIG. 4. Referring to FIG. 5, the circuit includes the two photodiodes 68a and 68b, as well as a first photodiode active region 53a', a second photodiode active region 53a", and a transistor active region 53b. The circuit also includes a first transfer gate (TG1) 59a for activating a first transfer transistor to transfer charge from the first photodiode 68a and a second transfer gate (TG2) 59b for activating a second transfer transistor to transfer charge from the second photodiode 68b. The circuit also includes a reset gate RG for activating a reset transistor, a drive gate DG for activating a driver transistor, a select gate SG for activating a select transistor, a contact 77h and an interconnection 79. The circuit also includes a floating diffusion (FD) region 75.

FIGS. 6 through 11 are schematic cross-sectional views taken along line I–I' of FIG. 5 illustrating a process of forming the image sensor device of FIG. 5 in accordance with the invention.

Figure 6:
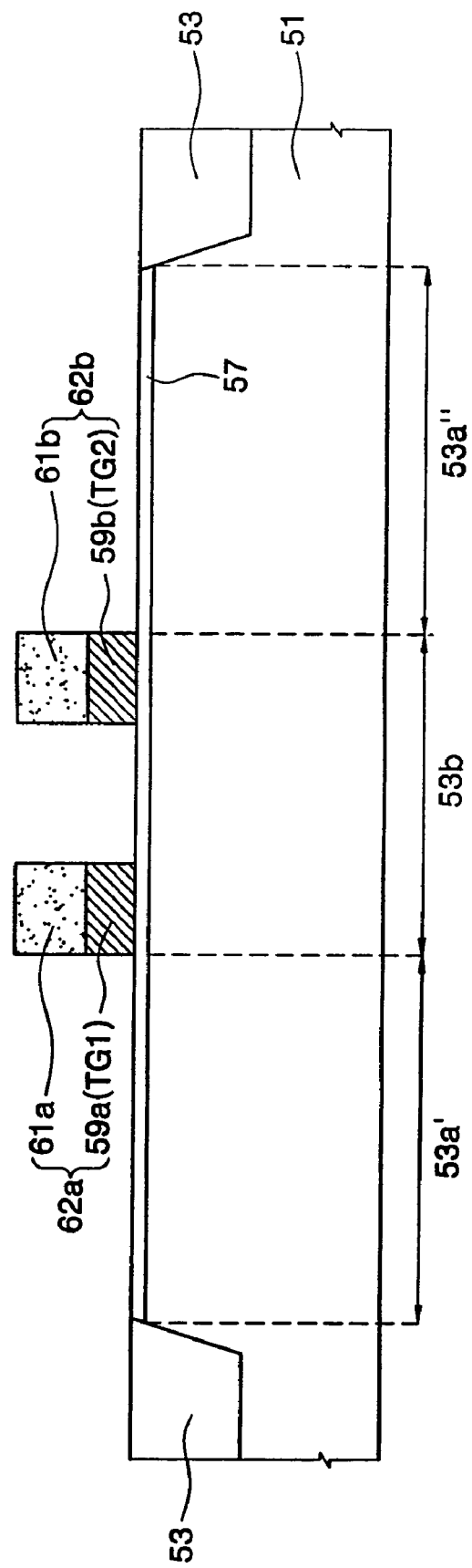
FIGS. 6 through 11 are schematic cross-sectional views taken along line I–I' of FIG. 5 illustrating a process of forming the image sensor device of FIG. 5 in accordance with the invention.

Referring to FIG. 6, a p-type substrate 51 is prepared. An isolation layer 53 is formed by a process such as local oxidation of silicon (LOCOS) or shallow trench isolation (STI). The first photodiode active region 53$a'$, the second photodiode active region 53$a''$ and the transistor active region 53$b$ are defined on the substrate 51. A gate dielectric layer 57 is formed on the substrate 51. A gate electrode layer made of polysilicon or tungsten silicide is formed on the gate dielectric layer 57, and a masking layer made of silicon oxynitride (SiON) or silicon nitride (SiN) is formed on the gate electrode layer. The SiON or SiN masking layer may serve as an anti-reflective layer during photolithography used to pattern the gate structure. The gate electrode layer and masking layer are etched to pattern the layers to form transfer gate structures 62$a$ and 62$b$. The transfer gate structure 62$a$ includes the first transfer gate (TG1) 59$a$ and a first initial masking layer pattern 61$a$ stacked on the gate dielectric layer 57. The transfer gate structure 62$b$ includes the second transfer gate (TG2) 59$b$ and a second initial masking layer pattern 61$b$ stacked on the gate dielectric layer 57. The etching step can be carried out by using an anisotropic dry etching down to the gate dielectric layer 57. The reset, drive, select and other gates may also be patterned during this step.

Figure 7:
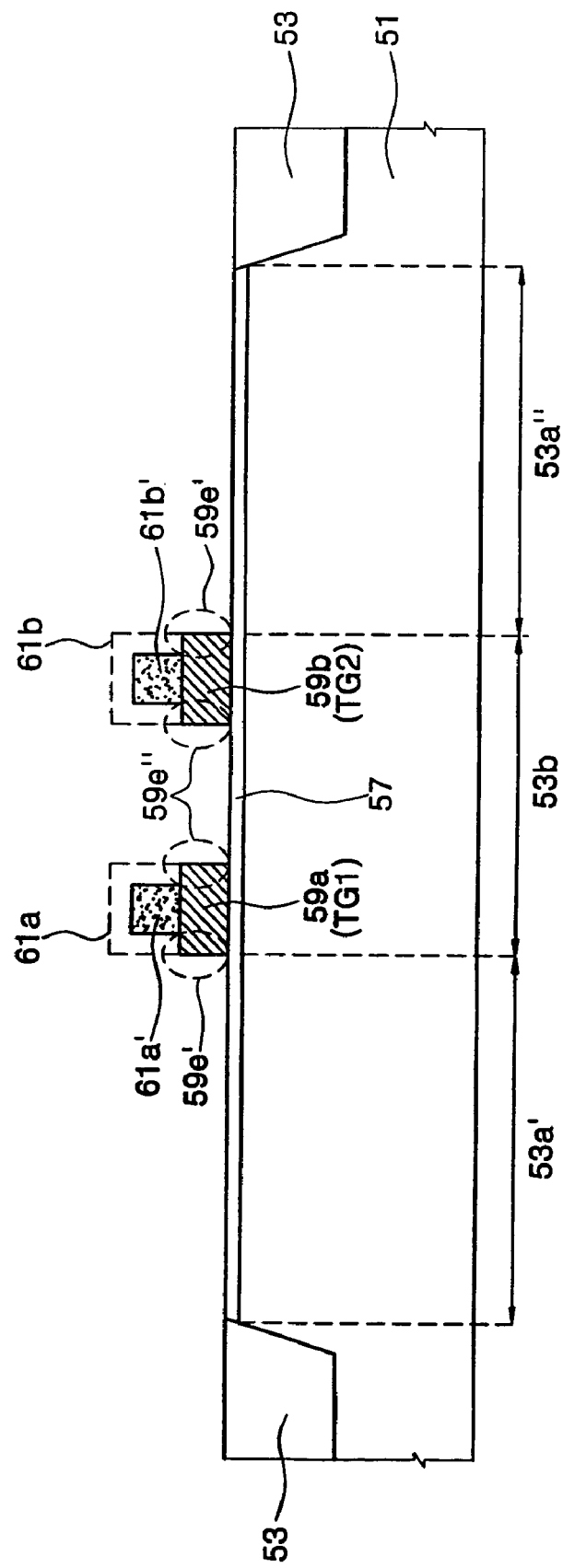

Referring to FIG. 7, the first initial masking layer patterns 61$a$ and 61$b$ (shown in dashed lines) are isotropically etched, such as by wet etching. The etching solution can include $NH_4OH$, HF, $H_2O_2$ or deionized water, or a combination thereof. The ratios and concentrations f the etchant constituents is determined by considering the desired etching rate of the masking layer patterns, which is based on whether the masking layer patterns are formed of SION or SiN. As a result of the wet etching of the first and second initial masking layer patterns 61$a$ and 61$b$, the first final masking layer pattern 61$a'$ and 61$b'$, respectively, are formed.

As noted from FIG. 7, the widths of the first and second final masking layer patterns 61$a'$ and 61$b'$ are less than the widths of the corresponding first transfer gate (TG1) 59$a$ and second transfer gate (TG2) 59$b$, respectively. That is, both of the transfer gates 59$a$ and 59$b$ include exposed protruding portions 59$e'$ and 59$e''$.

Figure 8:
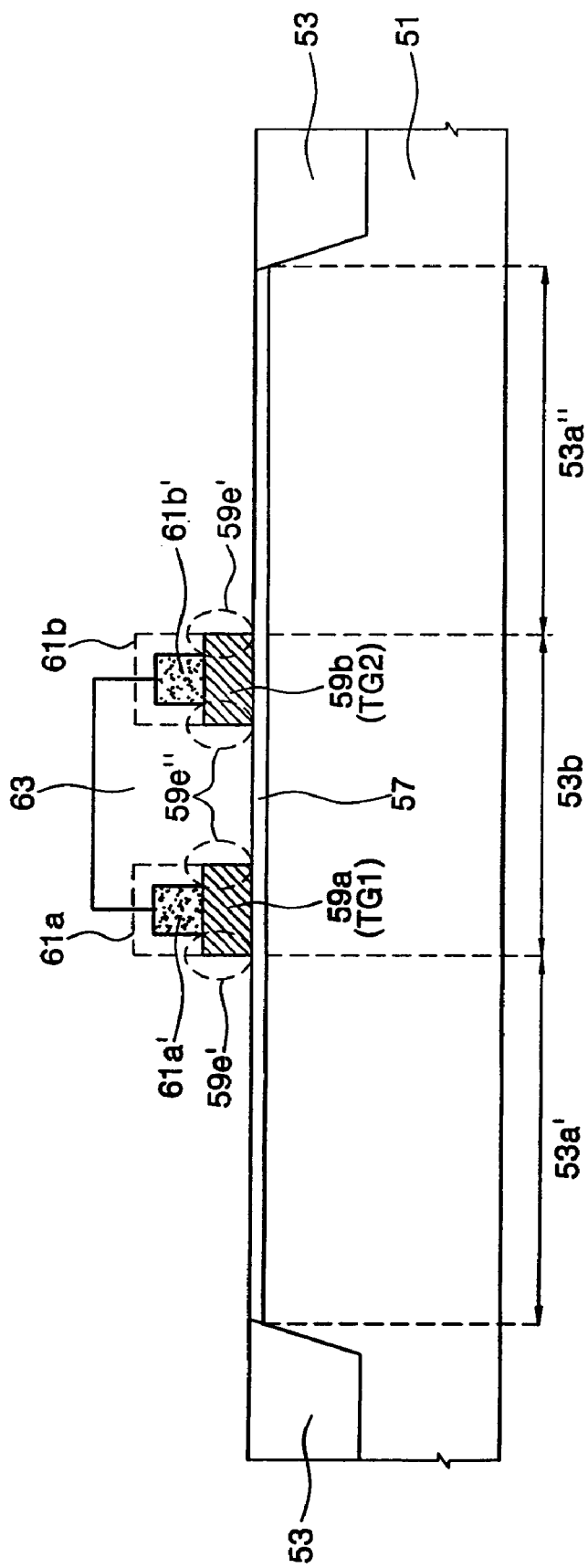

Referring to FIG. 8, a photoresist pattern 63 is formed on the structure and patterned. The resulting photoresist pattern is formed on portions of the first and second final masking layer patterns 61$a'$ and 61$b'$ and on the portion of the gate dielectric layer 57 between the two transfer gate structures as shown. The photoresist pattern 63 is formed to leave end portions 59$e'$ of the transfer gates 59$a$ and 59$b$ exposed.

Figure 9:
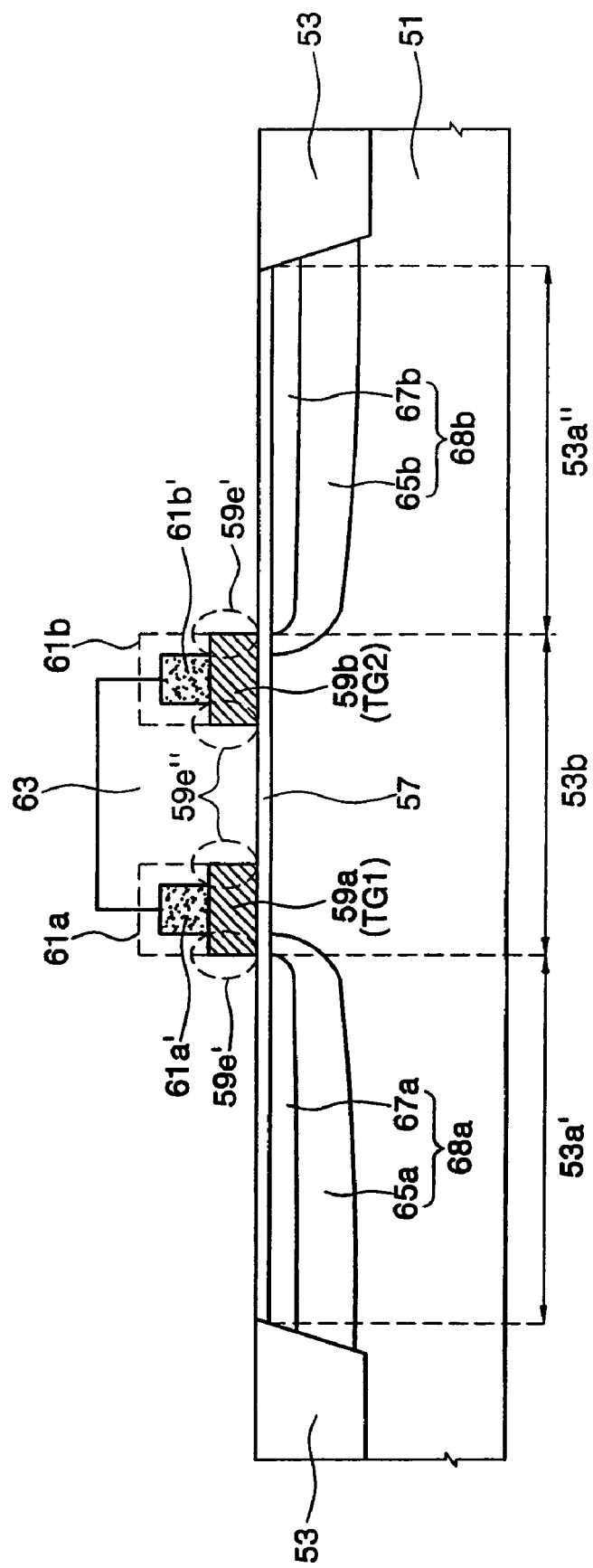

Referring to FIG. 9, a high-energy ion implantation is used to form two n-type photodiodes 65$a$ and 65$b$. The high-energy ion implantation penetrates the transfer gates 59$a$ and 59$b$ such that the photodiodes 65$a$ and 65$b$ are self-aligned with the final masking layer patterns 61$a'$ and 61$b'$ and overlaps with the transfer gates 59$a$ and 59$b$. Because the high-energy ion implantation penetrates the transfer gates 59$a$ and 59$b$, the photodiodes 65$a$ and 65$b$ can be formed to extend under the edges of the transfer gates 59$a$ and 59$b$, i.e., to overlap the transfer gates 59$a$ and 59$b$, without the need for a tilted ion implantation, i.e., a zero-degree ion implantation is used.

A high-concentration ion implantation is performed to form HAD regions 67$a$ and 67$b$. The high-concentration ion implantation does not penetrate the transfer gates 59$a$ and 59$b$ such that the HAD regions 67$a$ and 67$b$ are self-aligned with the transfer gates 59$a$ and 59$b$. As a result, the HAD regions 67$a$ and 67$b$ are surrounded by the photodiodes 65$a$ and 65$b$, respectively.

Figure 10:
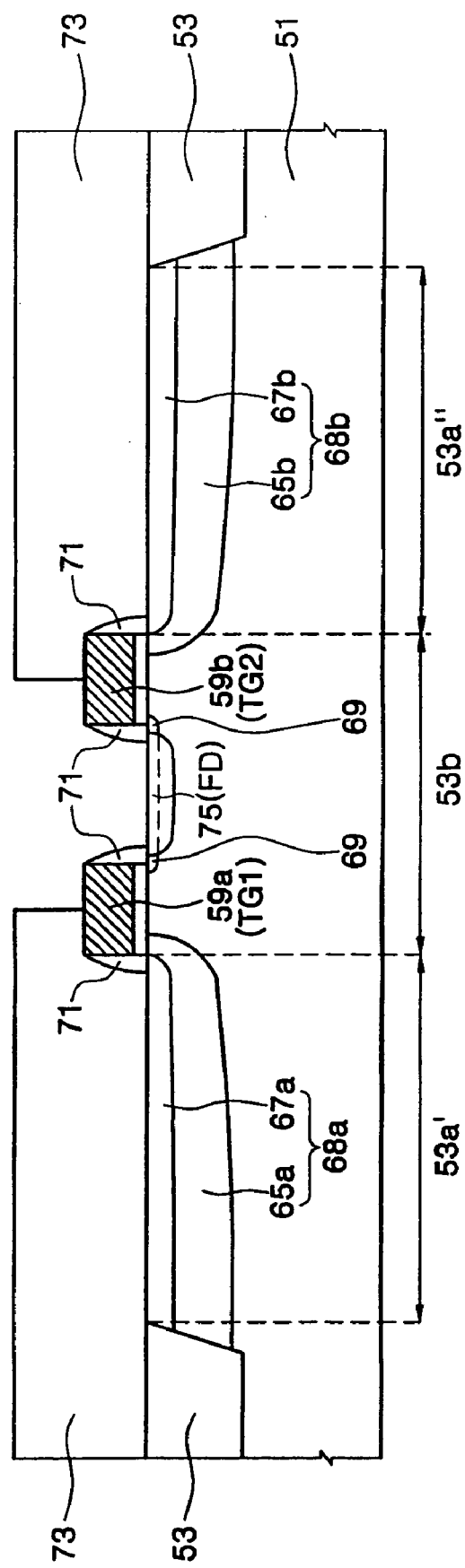

Referring to FIG. 10, the photoresist pattern 63 and the final masking layer patterns 61$a'$ and 61$b'$ are removed. Next, an n-type lightly-diffused drain (LDD) region 69 can optionally be formed by low-concentration ion implantation. Gate spacers 71 are formed on the sides of the transfer gates 59$a$ and 59$b$ by an etch-back process. A photoresist pattern 73 is formed and patterned over the structure as shown. An n-type floating diffusion region (FD) 75, which is shared by the two transfer gates 59$a$ and 59$b$, is formed by an n-type high-concentration ion implantation using the photoresist pattern 73, the transfer gates 59$a$ and 59$b$ and gate spacers 71 as ion implantation masks.

Figure 11:
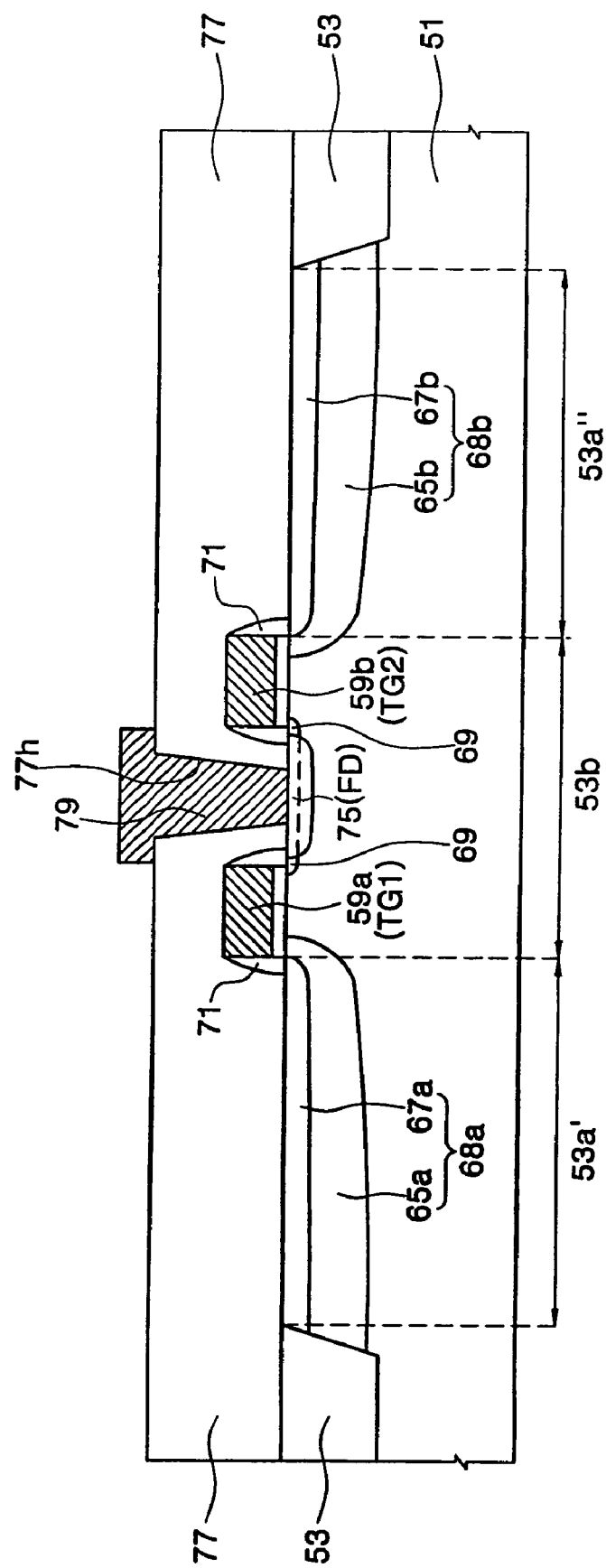

Referring to FIG. 11, an interlayer dielectric film 77 is deposited on the structure. A contact hole 77$h$ is formed in the interlayer dielectric film 77 down to the top surface of the floating diffusion region 75 and the LDD region 69 (if present). An interconnection 79 is then formed in the contact hole 77$h$.

Figure 1:
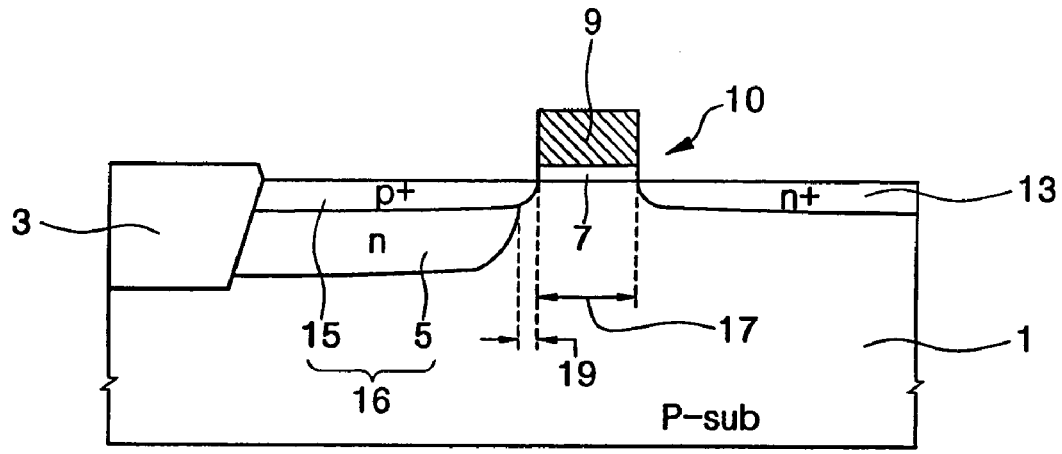
FIG. 1 is a schematic cross-sectional diagram of a conventional image sensor.
Figure 2:
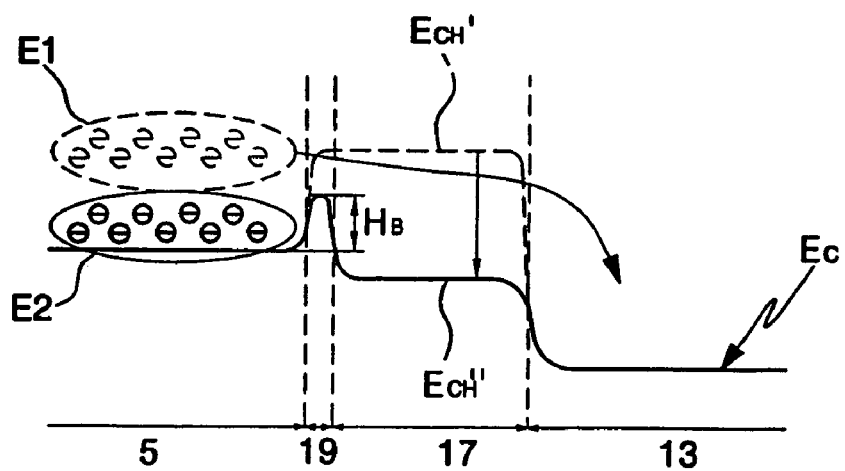
FIG. 2 is an energy band diagram corresponding to the image sensor device of FIG. 1.

In accordance with the invention, the photodiodes 65$a$ and 65$b$ are formed to overlap the transfer gates 59$a$ and 59$b$, that is, to overlap with the transfer gates 59$a$ and 59$b$. Because of the isotropic etching of the initial masking layer patterns 61$a$ and 61$b$ to form the final masking layer patterns 61$a'$ and 61$b'$, more accurate alignment of the photodiodes than would be achieved using conventional photolithography techniques is realized. As a result, the photodiodes 65$a$ and 65$b$ are symmetric. The offset 19 (see FIG. 1) in conventional image sensing devices is eliminated. This eliminates the image lag phenomenon found in conventional image sensing devices.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A device, comprising:
    a gate dielectric layer formed on a substrate;
    a transfer gate formed on the gate dielectric layer;
    a masking layer formed on the transfer gate, the masking layer having a width smaller than a width of the transfer gate, such that a portion of the transfer gate protrudes laterally from under the masking layer; and
    a photodiode formed in the substrate to be self-aligned with the masking layer and extending laterally under the transfer gate.

2. The device of claim 1, further comprising a hole accumulated device (HAD) region formed in the substrate to be aligned with an edge of the transfer gate.

3. The device of claim 1, wherein the photodiode is an n-type photodiode.

4. The device of claim 1, further comprising a floating diffusion region.

5. The device of claim 1, further comprising a reset transistor.

6. The device of claim 1, further comprising a driver transistor.

7. The device of claim 1, further comprising a select transistor.

8. The device of claim 1, further comprising:
    a second transfer gate formed on the gate dielectric layer;
    a second masking layer formed on the transfer gate, the second masking layer having a width smaller than a width of the second transfer gate, such that a portion of the second transfer gate protrudes laterally from under the second masking layer; and a second photodiode formed in the substrate to be self-aligned with the second masking layer and extending laterally under the second transfer gate.

9. The device of claim 8, wherein the second photodiode is an n-type photodiode.

10. The device of claim 8, further comprising a floating diffusion region shared by the first and second photodiodes.

11. The device of claim 8, further comprising a reset transistor.

12. The device of claim 8, further comprising a driver transistor.

13. The device of claim 8, further comprising a select transistor.

14. The device of claim 1, wherein the masking layer comprises silicon oxynitride.

15. The device of claim 1, wherein the masking layer comprises silicon nitride.

16. The device of claim 1, wherein the transfer gate comprises polysilicon.

* * * * *